United States Patent
Izumi et al.

(10) Patent No.: US 8,036,787 B2
(45) Date of Patent: Oct. 11, 2011

(54) CONTROL DEVICE FOR POWER STORAGE DEVICE AND VEHICLE

(75) Inventors: Junta Izumi, Toyota (JP); Teruo Ishishita, Nishikamo-gun (JP); Junichi Matsumoto, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 271 days.

(21) Appl. No.: 12/312,821

(22) PCT Filed: Dec. 28, 2007

(86) PCT No.: PCT/JP2007/075435
§ 371 (c)(1),
(2), (4) Date: May 28, 2009

(87) PCT Pub. No.: WO2008/082010
PCT Pub. Date: Jul. 10, 2008

(65) Prior Publication Data
US 2010/0010707 A1    Jan. 14, 2010

(30) Foreign Application Priority Data
Jan. 4, 2007  (JP) .................................. 2007-000135

(51) Int. Cl.
*G06F 7/00* (2006.01)
*B60K 1/04* (2006.01)
(52) U.S. Cl. ......... 701/29; 701/22; 180/65.31; 180/65.8
(58) Field of Classification Search .................... 701/22, 701/29; 180/65.31, 65.8
See application file for complete search history.

(56) References Cited

U.S. PATENT DOCUMENTS

| | | | | |
|---|---|---|---|---|
| 6,469,512 B2 * | 10/2002 | Singh et al. | ................... | 324/426 |
| 6,646,419 B1 * | 11/2003 | Ying | ............................. | 320/132 |
| 7,688,033 B2 * | 3/2010 | Minamiura | ................... | 320/134 |
| 7,768,233 B2 * | 8/2010 | Lin et al. | ....................... | 320/132 |

FOREIGN PATENT DOCUMENTS

| | | |
|---|---|---|
| EP | 1104771 A1 | 8/1999 |
| JP | A-10-104324 | 4/1998 |
| JP | A-10-260236 | 9/1998 |
| JP | A-2004-245673 | 9/2004 |
| JP | A-2005-014707 | 1/2005 |
| JP | A-2005-295644 | 10/2005 |
| JP | A-2006-105821 | 4/2006 |
| JP | A-2006-172783 | 6/2006 |

OTHER PUBLICATIONS

Mar. 23, 2010 Office Action issued in Japanese Patent Application No. 2007-000135 (with translation).

* cited by examiner

*Primary Examiner* — Sarah B McPartlin
(74) *Attorney, Agent, or Firm* — Oliff & Berridge, PLC (57) ABSTRACT

An SOC calculating unit calculates a first value based on an open voltage of a battery upon startup of a vehicle (when the operation of the battery starts), and has a calculated second value stored in a storage unit upon stop of the vehicle (when the operation of the battery ends). An initial value selecting unit selects the first value as an initial value when a predetermined condition is satisfied, and selects the second value as the initial value when this condition is not satisfied. In a case where the first value has low reliability, the second value is set as the initial value even if the second value may be deviated from an actual SOC value. This can reduce a difference between the SOC value stored in advance and the actual SOC value as compared with that in a case where the first value is set as the initial value.

16 Claims, 11 Drawing Sheets

| SOC DEVIATION (%) | | TEMPERATURE (°C) | | | | | | | | | |
|---|---|---|---|---|---|---|---|---|---|---|---|
| | | -30 | -20 | -10 | 0 | 10 | 20 | 30 | 40 | 50 | 60 |
| SOC BASED ON OCV (%) | 0 | | | | | | | | | | |
| | 5 | | | | | | | | | | |
| | 10 | | | | | | | | | | |
| | 20 | | | | | | A | | | | |
| | ... | | | | | | | | | | |
| | ... | | | | | | | | | | |
| | 80 | | | | | | | | | | |
| | 90 | | | | | | | | | | |
| | 100 | | | | | | | | | | |

CONTROL DEVICE FOR POWER STORAGE DEVICE AND VEHICLE

TECHNICAL FIELD

The present invention relates to a control device for a power storage device and a vehicle including the same. In particular, the present invention relates to a control device for a power storage device capable of accurately calculating a state of charge (SOC) of the power storage device, and a vehicle including the control device.

BACKGROUND ART

Generally on a vehicle, a battery is mounted as a power source of a load. Japanese Patent Laying-Open No. 2005-14707 discloses a state monitoring device for a vehicle-mounted battery capable of performing battery state monitoring while minimizing a current consumed during an engine stop period. This state monitoring device stores map information indicating a correlation between a charging rate of the battery and a terminal voltage (pseudo open voltage) when a charging/discharging current value of the vehicle-mounted battery is within a very narrow prescribed range. Furthermore, this state monitoring device stores a first charging rate SOC1 and a first remaining capacity SOH1 of the battery when the engine is stopped. When the charging/discharging current value while the engine is not operated is within the very narrow prescribed range, the state monitoring device periodically detects the terminal voltage (that is, pseudo open voltage) of the battery, and calculates a second charging rate SOC2 in accordance with the detected pseudo open voltage. The state monitoring device calculates a current remaining capacity SOC2 from first charging rate SOC1, first remaining capacity SOH1 and second charging rate SOC2. By setting a time interval between detection of the terminal voltage of the battery to, for example, about several hours, the current consumed by the state monitoring device can be reduced.

Japanese Patent Laying-Open No. 2005-14707 discloses that the state of charge of the battery after startup of the engine is calculated based on the discharging current and the terminal voltage of the battery. In a case where the battery is connected to the load, the terminal voltage of the battery changes from the open voltage and eventually stabilizes at a certain voltage. For example, in a case where the load has a large capacity, however, it takes a certain amount of time to stabilize the terminal voltage of the battery after the battery is connected to the load. Therefore, it is difficult to find accurate SOC before the terminal voltage of the battery is stabilized. Furthermore, in a case where SOC obtained at this time has low accuracy, it is also difficult to increase the accuracy of the result obtained by calculating SOC in accordance with charging/discharging of the battery.

DISCLOSURE OF THE INVENTION

An object of the present invention is to provide, in a vehicle having a rechargeable power storage device mounted thereon, a control device for the power storage device capable of finding an accurate state of charge upon startup of the vehicle, and the vehicle including the control device.

In summary, the present invention is directed to a control device for a rechargeable power storage device. The power storage device is connected to a load with a connecting unit interposed. The connecting unit changes from a non-conduction state to a conduction state when an operation of the power storage device starts, and changes from the conduction state to the non-conduction state when the operation of the power storage device ends. The control device includes a calculating unit, a storage unit and a selecting unit. The calculating unit calculates a first value indicating a state of charge of the power storage device, based on an open voltage of the power storage device, when the operation of the power storage device starts and when the connecting unit is brought out of conduction. The calculating unit calculates the state of charge of the power storage device, based on an initial value of the state of charge of the power storage device and charging/discharging electric power of the power storage device, when the connecting unit is brought into conduction. The storage unit receives a calculation result of the state of charge of the power storage device from the calculating unit and stores the calculation result as a second value, when the operation of the power storage device ends. The selecting unit selects the first value as the initial value when a predetermined condition is satisfied, and selects the second value as the initial value when the predetermined condition is not satisfied.

Preferably, the predetermined condition is satisfied in a case where an absolute value of a difference between the first value and the second value is larger than a reference value.

More preferably, the reference value is defined based on a temperature of the power storage device when the operation of the power storage device ends.

More preferably, the reference value is defined based on the first value and a temperature of the power storage device when the operation of the power storage device ends.

Preferably, the predetermined condition is satisfied in a case where the calculating unit is able to calculate the first value. The calculating unit determines that the first value is calculable in a case where a value of the open voltage is larger than or equal to a prescribed value.

Preferably, the predetermined condition is satisfied in a case where the calculating unit is able to calculate the first value. The calculating unit obtains a value of the open voltage of the power storage device for a plurality of times, and in a case where a variation in the obtained voltage values is within a prescribed range, the calculating unit determines that the first value is calculable.

Preferably, the control device further includes a voltage sensing unit for sensing a voltage of the power storage device. The predetermined condition is satisfied in a case where both of the connecting unit and the voltage sensing unit are normal.

Preferably, the predetermined condition is satisfied in a case where a time period from when the operation of the power storage device ends to when the operation of the power storage device starts is longer than a prescribed time period.

Preferably, in a range of a value indicating the state of charge that is defined as a usage condition of the power storage device, the open voltage of the power storage device changes monotonically with respect to the value of the state of charge of the power storage device.

More preferably, the power storage device includes a lithium ion battery.

More preferably, the power storage device includes a nickel hydride battery.

According to another aspect of the present invention, the present invention is directed to a vehicle including a rechargeable power storage device, a load, a connecting unit, and a control device. The connecting unit changes from a non-conduction state to a conduction state to connect the power storage device and the load when an operation of the power storage device starts, and changes from the conduction state to the non-conduction state when the operation of the power storage device ends. The control device controls the power storage device. The control device includes a calculating unit, a storage unit and a selecting unit. The calculating unit calculates a first value indicating a state of charge of the power storage device, based on an open voltage of the power storage device, when the operation of the power storage device starts and when the connecting unit is brought out of conduction. The calculating unit calculates the state of charge of the power storage device, based on an initial value of the state of charge of the power storage device and charging/discharging electric power of the power storage device, when the connecting unit is brought into conduction. The storage unit receives a calculation result of the state of charge of the power storage device from the calculating unit and stores the calculation result as a second value, when the operation of the power storage device ends. The selecting unit selects the first value as the initial value when a predetermined condition is satisfied, and selects the second value as the initial value when the predetermined condition is not satisfied.

Preferably, the predetermined condition is satisfied in a case where an absolute value of a difference between the first value and the second value is larger than a reference value.

More preferably, the reference value is defined based on a temperature of the power storage device when the operation of the power storage device ends.

More preferably, the reference value is defined based on the first value and a temperature of the power storage device when the operation of the power storage device ends.

Preferably, the predetermined condition is satisfied in a case where the calculating unit is able to calculate the first value. The calculating unit determines that the first value is calculable in a case where a value of the open voltage is larger than or equal to a prescribed value.

Preferably, the predetermined condition is satisfied in a case where the calculating unit can calculate the first value. The calculating unit obtains a value of the open voltage of the power storage device for a plurality of times, and in a case where a variation in the obtained voltage values is within a prescribed range, the calculating unit determines that the first value is calculable.

Preferably, the control device further includes a voltage sensing unit for sensing a voltage of the power storage device. The predetermined condition is satisfied in a case where both of the connecting unit and the voltage sensing unit are normal.

Preferably, the predetermined condition is satisfied in a case where a time period from when the operation of the power storage device ends to when the operation of the power storage device starts is longer than a prescribed time period.

Preferably, in a range of a value indicating the state of charge that is defined as a usage condition of the power storage device, the open voltage of the power storage device changes monotonically with respect to the value of the state of charge.

More preferably, the power storage device includes a lithium ion battery.

More preferably, the power storage device includes a nickel hydride battery.

Therefore, according to the present invention, the accurate state of charge can be found when the operation of the power storage device starts.

BEST MODES FOR CARRYING OUT THE INVENTION

Embodiments of the present invention will be described hereinafter in detail with reference to the drawings, wherein the same or corresponding parts are represented by the same reference characters, and the description thereof will not be repeated.

Figure 1:
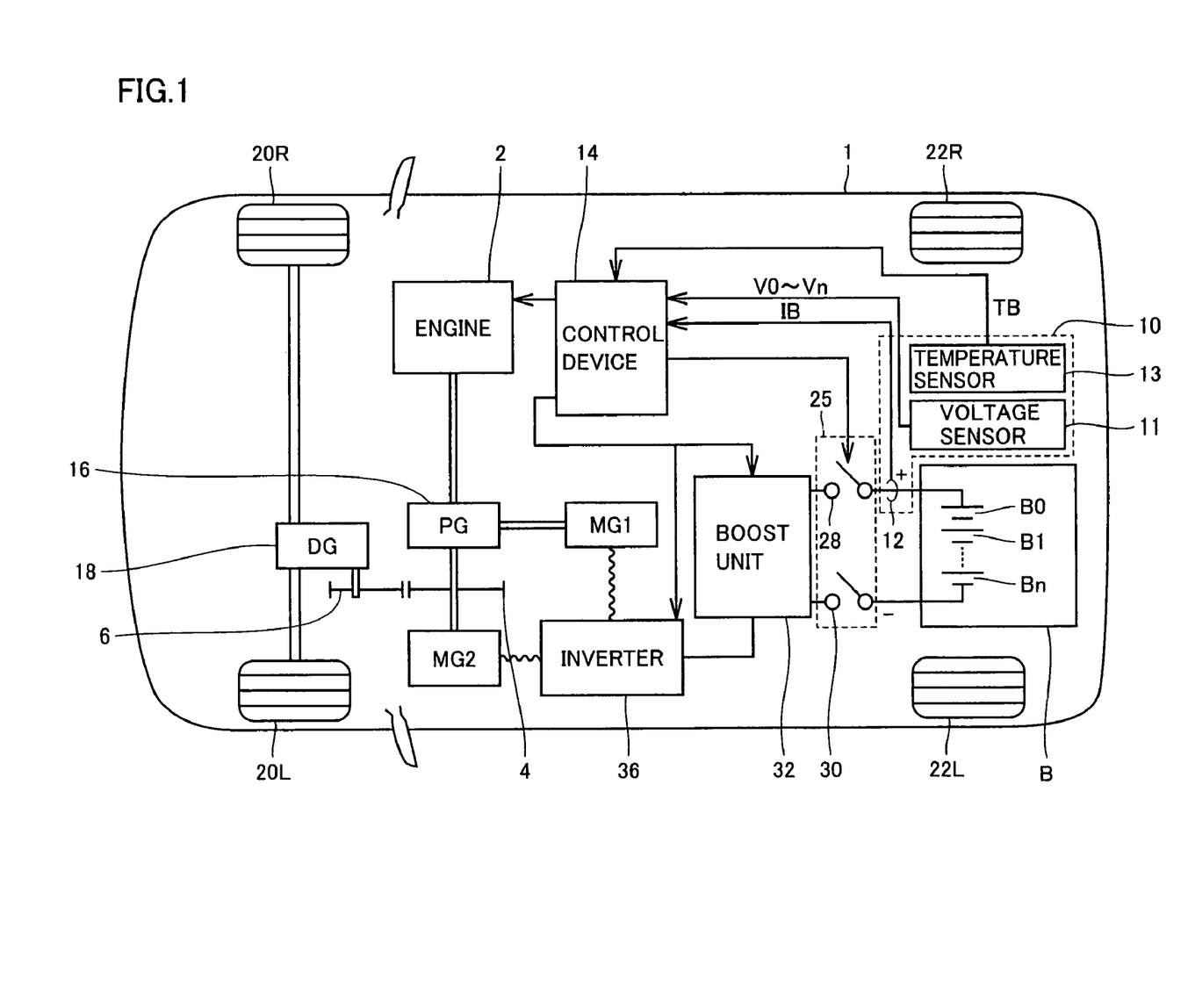
FIG. 1 shows a main configuration of a hybrid vehicle 1 in the present embodiment.

FIG. 1 shows a main configuration of a hybrid vehicle 1 in the present embodiment. Hybrid vehicle 1 is a vehicle that is driven by using an engine and a motor. Referring to FIG. 1, hybrid vehicle 1 includes front wheels 20R and 20L, rear wheels 22R and 22L, an engine 2, a planetary gear 16, a differential gear 18, and gears 4 and 6.

Hybrid vehicle 1 further includes a battery B located at the vehicle rear, a monitoring unit 10 for monitoring a voltage, a current and a temperature of battery B, a boost unit 32 for boosting direct current (DC) electric power output by battery B, an inverter 36 for receiving and transmitting the DC electric power from/to boost unit 32, a motor generator MG1 coupled to engine 2 with planetary gear 16 interposed therebetween mainly for generating electric power, and a motor generator MG2 having a rotation shaft thereof connected to planetary gear 16. Inverter 36 is connected to motor generators MG1 and MG2 for performing conversion between alternating current (AC) electric power and the DC electric power from boost unit 32.

Planetary gear 16 has first to third rotation shafts. The first rotation shaft is connected to engine 2, the second rotation shaft is connected to motor generator MG1, and the third rotation shaft is connected to motor generator MG2.

This third rotation shaft has gear 4 attached thereto, and this gear 4 transfers motive power to differential gear 18 by driving gear 6. Differential gear 18 transfers the motive power received from gear 6 to front wheels 20R and 20L, and in addition, transfers torque of front wheels 20R and 20L to the third rotation shaft of the planetary gear via gears 6 and 4.

Planetary gear 16 serves to divide motive power among engine 2, motor generators MG1 and MG2. In other words, if rotation of the two rotation shafts out of the three rotation shafts of planetary gear 16 is defined, rotation of the remaining one rotation shaft is forcibly determined. Therefore, a vehicle speed is controlled by controlling an amount of electric power generated at motor generator MG1 and driving motor generator MG2 while operating engine 2 most efficiently. As a result, an energy-efficient vehicle as a whole is realized.

It is noted that a reduction gear reducing rotation of motor generator MG2 and transferring the reduced rotation to planetary gear 16, or a transmission gear allowing change of the reduction ratio of the reduction gear may be provided.

Battery B serving as a rechargeable power storage device includes a secondary battery such as a nickel hydride battery or a lithium ion battery. Battery B supplies DC electric power to boost unit 32, and in addition, is charged with DC electric power from boost unit 32. Battery B is an assembled battery and includes a plurality of battery blocks B0-Bn connected in series.

It is noted that, although the battery including the secondary battery is used as the rechargeable power storage device in the present embodiment, the power storage device may be, for example, an electric double layer capacitor or may include a secondary battery and a capacitor.

Monitoring unit 10 includes a voltage sensor 11, a current sensor 12 and a temperature sensor 13 for sensing a voltage, a current and a temperature of battery B, respectively. Voltage sensor 11 senses respective voltages V0-Vn of the plurality of battery blocks B0-Bn, and outputs the result obtained by the sensing to a control device 14. Current sensor 12 senses a current IB flowing through battery B, and outputs the result obtained by the sensing to control device 14. Temperature sensor 13 senses a temperature TB of battery B, and outputs the result obtained by the sensing to control device 14.

Boost unit 32 boosts a DC voltage received from battery B and supplies the boosted DC voltage to inverter 36. Inverter 36 converts the supplied DC voltage into an AC voltage, and controls driving of motor generator MG1 upon startup of the engine. Furthermore, after startup of the engine, AC electric power generated by motor generator MG1 is converted into DC by inverter 36, and the DC is converted into a voltage appropriate for charging of battery B by boost unit 32 to charge battery B.

Inverter 36 also drives motor generator MG2. Motor generator MG2 assists engine 2 and drives front wheels 20R and 20L. At the time of braking, the motor generator performs regenerative operation and converts rotational energy of the wheels into electrical energy. The obtained electrical energy is returned to battery B via inverter 36 and boost unit 32. Between boost unit 32 and battery B, a connecting unit 25 connecting battery B and a load (including boost unit 32 and inverter 36) when the vehicle is operated is provided. Connecting unit 25 includes system main relays 28 and 30. When the vehicle is not operated, connecting unit 25 is brought out of conduction and a high voltage is cut off.

Hybrid vehicle 1 further includes control device 14. Control device 14 controls engine 2, inverter 36, boost unit 32, and connecting unit 25 in accordance with instructions by the driver and outputs from various sensors attached to the vehicle.

Figure 2:
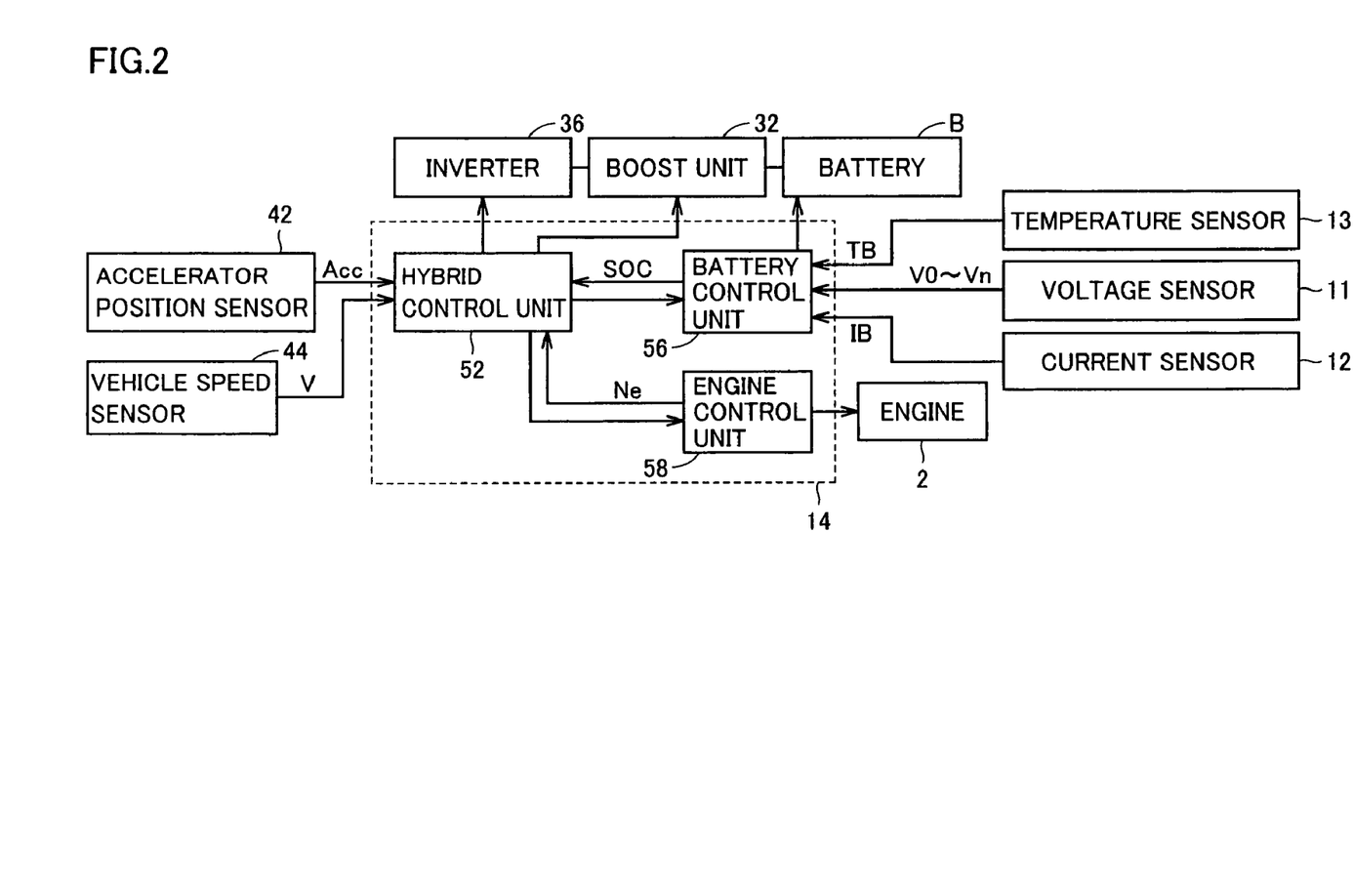
FIG. 2 shows peripheral devices related to functional blocks of a control device 14 in FIG. 1.

FIG. 2 shows peripheral devices related to functional blocks of control device 14 in FIG. 1. It is noted that this control device 14 can be implemented by any of software and hardware. Referring to FIG. 2, control device 14 includes a hybrid control unit 52, a battery control unit 56 and an engine control unit 58.

Battery control unit 56 calculates a state of charge (SOC) of battery B based on temperature value TB received from temperature sensor 13, voltage values V0-Vn received from voltage sensor 11, current value IB received from current sensor 12, and the like, and transmits the value of calculated SOC to hybrid control unit 52. It is noted that a method for determining the state of charge of battery B upon startup of hybrid vehicle 1 will be described hereinafter. Furthermore, "value indicating SOC" may be simply referred to as "SOC" hereinafter.

Engine control unit 58 controls a throttle of engine 2. Furthermore, engine control unit 58 detects an engine rotation speed Ne of engine 2 and transmits detected engine rotation speed Ne to hybrid control unit 52.

Hybrid control unit 52 calculates an output required by the driver (required power) based on an output signal Acc of an accelerator position sensor 42 and a vehicle speed V detected by a vehicle speed sensor 44. In addition to this required power by the driver, hybrid control unit 52 calculates necessary driving power (total power) in consideration of the state of charge of battery B, and further calculates a rotation speed required for the engine and power required for the engine.

Hybrid control unit 52 transmits the required rotation speed and the required power to engine control unit 58, and causes engine control unit 58 to control the throttle of engine 2.

Hybrid control unit 52 calculates torque required by the driver in accordance with a driving condition, causes inverter 36 to drive motor generator MG2, and causes motor generator MG1 to generate electric power as required.

Driving power of engine 2 is divided into power for directly driving the wheels and power for driving motor generator MG1. The driving power of the vehicle is the sum of driving power of motor generator MG2 and power directly obtained from the engine.

Figure 3:
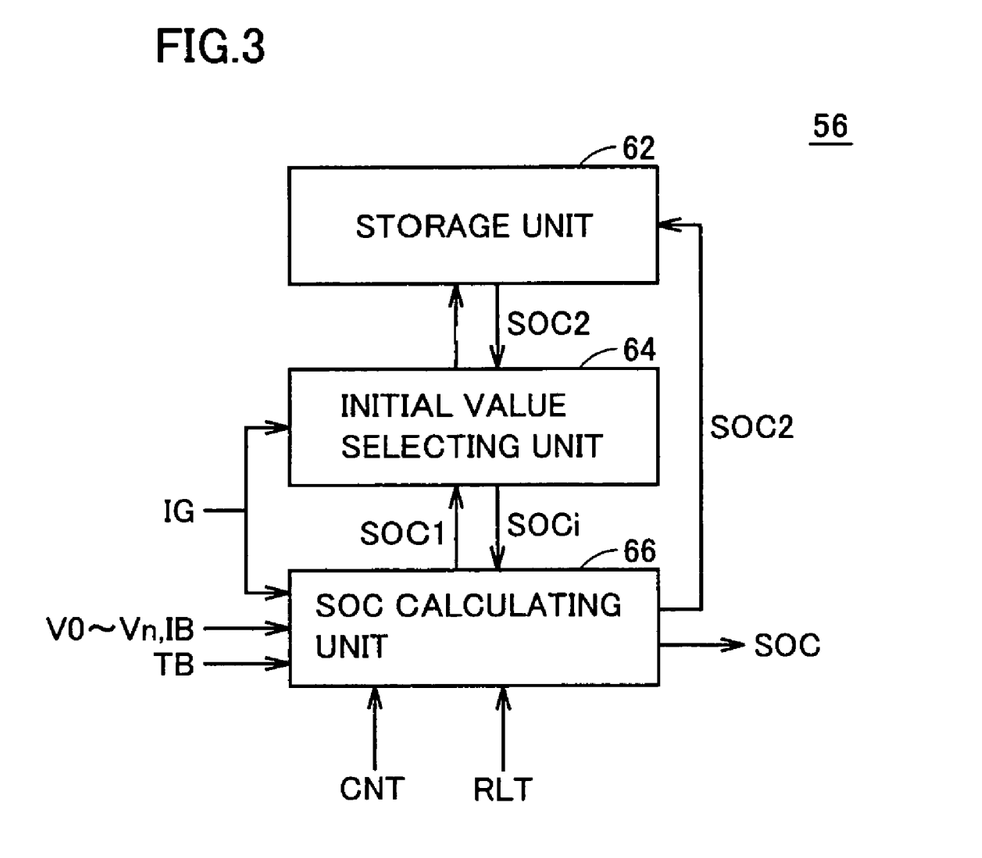
FIG. 3 is a functional block diagram of a battery control unit 56 in FIG. 2.

FIG. 3 is a functional block diagram of battery control unit 56 in FIG. 2. Referring to FIG. 3, battery control unit 56 includes a storage unit 62, an initial value selecting unit 64 and an SOC calculating unit 66.

When a startup instruction IG for instructing startup of the vehicle (in other words, start of the operation of battery B) is rendered active, SOC calculating unit 66 calculates an SOC value based on voltage values V0-Vn, and outputs a value SOC1 that is the result of the calculation to initial value selecting unit 64. It is noted that voltage values V0-Vn at this time refer to a battery voltage when connecting unit 25 in FIG. 1 is in the non-conduction state, that is, an open voltage (OCV).

When connecting unit 25 is brought into conduction and battery B is connected to the load, SOC calculating unit 66 receives an initial value SOCi from initial value selecting unit 64, and calculates the state of charge based on temperature value TB as well as charging/discharging electric power of battery B defined by voltage values V0-Vn and current value IB. When startup instruction IG is rendered inactive due to stop of the vehicle (in other words, when the operation of battery B ends), SOC calculating unit 66 has an SOC value at that point stored in storage unit 62 as a value SOC2. This value is retained in storage unit 62 while the vehicle is being stopped.

When startup instruction IG is rendered active, initial value selecting unit 64 receives value SOC1 from SOC calculating unit 66, and in addition, reads value SOC2 from storage unit 62. Initial value selecting unit 64 selects value SOC1 as initial value SOCi when a predetermined condition is satisfied, and selects value SOC2 as initial value SOCi when the predetermined condition is not satisfied. Then, initial value selecting unit 64 outputs initial value SOCi to SOC calculating unit 66.

Now, a case is considered where the SOC value upon stop of the vehicle (SOC2) that has been stored in storage unit 62 is used as initial value SOCi when the vehicle starts up next time. SOC is decreased because of discharge and the like of battery B even while the vehicle is being stopped. As a time period during which the vehicle is being stopped is prolonged (for example, one week), an amount of decrease in the SOC value from when the vehicle has been stopped is increased. Therefore, an actual SOC value widely differs from the stored value.

Furthermore, in a case where storage unit 62 is, for example, a volatile storage device such as an SRAM (Static Random Access Memory), the value stored in the storage device disappears if the storage device is powered down for some reason. In preparation for such a situation, it is considered that initial value SOCi is set to a fixed value (for example, 60%) when storage unit 62 is powered down. In such a case, however, the fixed value is not necessarily equal to the actual SOC value.

In a case where a difference between the actual SOC value and the SOC value stored in advance is widened, it takes a longer time to calculate an accurate SOC value upon startup of the vehicle. Or there is also a possibility that the SOC value calculated by SOC calculating unit 66 continues to have a certain amount of deviation from the actual SOC value. If calculation of SOC continues with a significant deviation between the calculated SOC value and the actual SOC value, the battery may be overcharged or overdischarged, or the operation of the vehicle may be affected because electric power input/output from/to the battery is reduced more than necessary.

In the present embodiment, when the operation of the secondary battery starts, SOC calculating unit 66 calculates SOC of battery B based on the open voltage of battery B. Since SOC is calculated based on the battery voltage in a state where battery B is not connected to the load, the accurate SOC value can be found. As a result, overcharging and overdischarging of the battery can be prevented. Furthermore, since SOC of the battery is accurately calculated, an amount of electric power generated by motor generators MG1 and MG2 while the hybrid vehicle is traveling can be calculated more accurately. Therefore, the energy efficiency of the hybrid vehicle can be enhanced.

In a case where voltage values V0-Vn obtained by SOC calculating unit 66 have a problem in terms of reliability (for example, in a case where the voltage sensor fails, in a case where connecting unit 25 has already been brought into conduction, or the like), value SOC1 calculated by SOC calculating unit 66 becomes an erroneous value. Therefore, in the present embodiment, initial value selecting unit 64 selects value SOC1 as initial value SOC1 when the predetermined condition is satisfied, and selects value SOC2 as initial value SOC1 when the condition is not satisfied. In a case where value SOC1 has low reliability, value SOC2 is set as initial value SOC1 even if value SOC2 may be deviated from the actual SOC value. This can reduce the difference between the SOC value stored in advance and the actual SOC value as compared with that in a case where value SOC1 is set as initial value SOC1.

Figure 4:
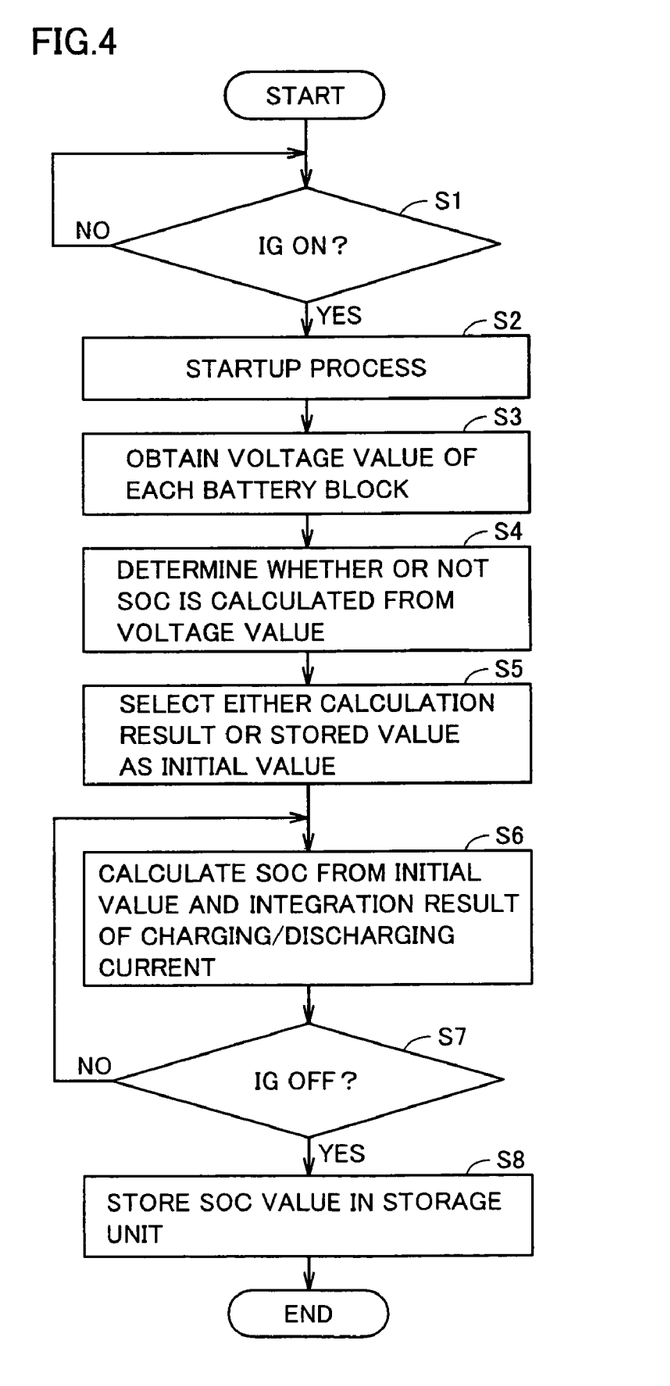
FIG. 4 is a flowchart for illustrating a state of charge calculating process performed by battery control unit 56 shown in FIG. 3.

FIG. 4 is a flowchart for illustrating a state of charge calculating process performed by battery control unit 56 shown in FIG. 3. Referring to FIG. 4, in step S1, initial value selecting unit 64 and SOC calculating unit 66 determine whether or not startup instruction IG is rendered active (startup instruction IG is set to the "ON" state). In a case where startup instruction IG is not rendered active (NO in step S1), the determination process in step S1 is repeated. In a case where startup instruction IG is rendered active (YES in step S1), a process in step S2 is performed.

In step S2, the process of starting up battery control unit 56 is performed. For example, SOC calculating unit 66 performs a preparation process to allow data reception from monitoring unit 10.

In step S3, SOC calculating unit 66 obtains a voltage value (voltage values V0-Vn) of each battery block. In step S4, SOC calculating unit 66 determines whether or not the system main relays are in the non-conduction state, or determines whether or not the voltage value has reliability, thereby determining whether or not an initial value of SOC is calculated from the voltage value.

If SOC calculating unit 66 determines that the initial value of SOC is calculated from the voltage value, SOC calculating unit 66 calculates value SOC1 in step S5. Initial value selecting unit 64 selects, as initial value SOCi, either the result of the calculation by SOC calculating unit 66 (value SOC1) or value SOC2 stored in storage unit 62.

In step S6, SOC calculating unit 66 calculates SOC based on initial value SOCi and the result obtained by integrating a charging/discharging current value. It is noted that voltage values V0-Vn, temperature value TB and the like may further be used to calculate SOC.

In step S7, SOC calculating unit 66 determines whether or not startup instruction IG is rendered inactive (startup instruction IG is set to the "OFF" state). In a case where startup instruction IG is not rendered inactive (NO in step S7), the process is returned to step S6. In a case where startup instruction IG is rendered inactive (YES in step S7), SOC calculating unit 66 has the SOC value at that time (value SOC2) stored in storage unit 62 in step S8. When the process in step S8 ends, the overall process ends.

Next, the processes in steps S3 to S5 will be described in detail.

Figure 5:
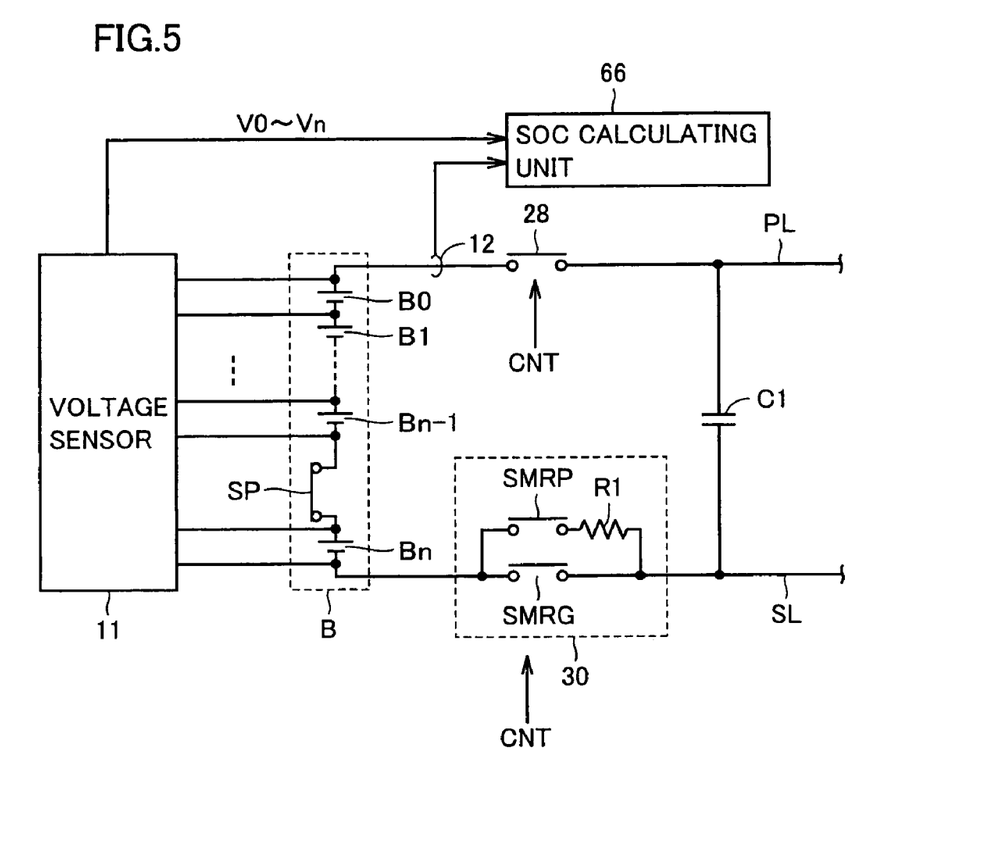
FIG. 5 is a diagram for illustrating a configuration on the periphery of a battery B in more detail.

FIG. 5 is a diagram for illustrating a configuration on the periphery of battery B in more detail. Referring to FIG. 5, battery B includes battery blocks B0-Bn connected in series. A service plug SP for allowing cutoff of a high voltage is provided between battery blocks Bn-1 and Bn. Battery B has a positive electrode connected to a power supply line PL with system main relay 28 interposed therebetween, and a negative electrode connected to a ground line SL with system main relay 30 interposed therebetween. A smoothing capacitor C1 is connected between power supply line PL and ground line SL.

System main relay 30 includes a system main relay SMRP and a resistance R1 connected in series between the negative electrode of battery B and ground line SL, as well as a system main relay SMRG directly connecting the negative electrode of battery B and ground line SL. System main relays 28 and 30 are controlled between the conduction state and the non-conduction state, in accordance with a control signal CNT from hybrid control unit 52 (see FIG. 2). For example, if control signal CNT is at an H (logic high) level, system main relays 28 and 30 are brought into conduction. If control signal CNT is at an L (logic low) level, system main relays 28 and 30 are brought out of conduction.

Voltage sensor 11 senses voltages of battery blocks B0-Bn, and outputs voltage values V0-Vn to SOC calculating unit 66. Current sensor 12 senses a current flowing through battery B, and outputs the sensed current value to SOC calculating unit 66.

Figure 6:
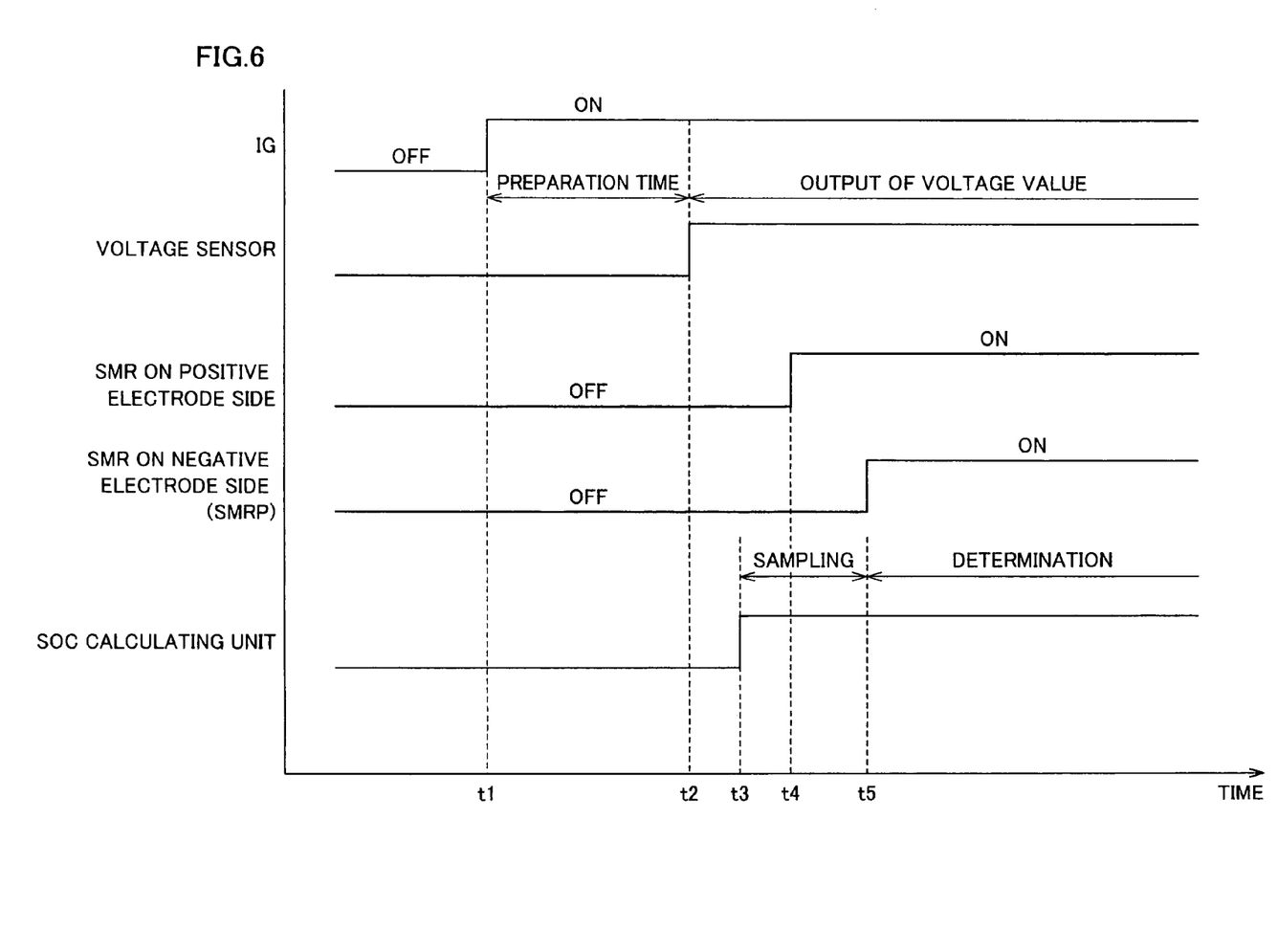
FIG. 6 is a timing chart for illustrating the operation of an SOC calculating unit 66 in chronological order.

FIG. 6 is a timing chart for illustrating the operation of SOC calculating unit 66 in chronological order. In FIG. 6, at time t1, startup instruction IG is changed from the OFF state to the ON state. The time period from time t1 to time t2 is a preparation period for output of a voltage value by voltage sensor 11. At time t2, voltage sensor 11 starts to output the voltage value. From time t3, SOC calculating unit 66 samples the voltage value of each battery block. The number of times of the sampling is not particularly limited. For example, SOC calculating unit 66 obtains the voltage values of each battery block five times.

At time t4, the system main relay (shown as "SMR" in FIG. 6) on the positive electrode side of battery B, that is, system main relay 28 is changed from the OFF state to the ON state. Thereafter, at time t5, system main relay SMRP serving as SMR on the negative electrode side of battery B is changed from the OFF state to the ON state. Since battery B is not connected to the load during the time period before time t5, SOC calculating unit 66 can obtain a value of the open voltage of battery B. Since battery B is connected to the load after time t5, SOC calculating unit 66 finishes the sampling of the voltage value, and determines whether or not the initial value of SOC can be calculated based on the result of the sampling.

Figure 7:
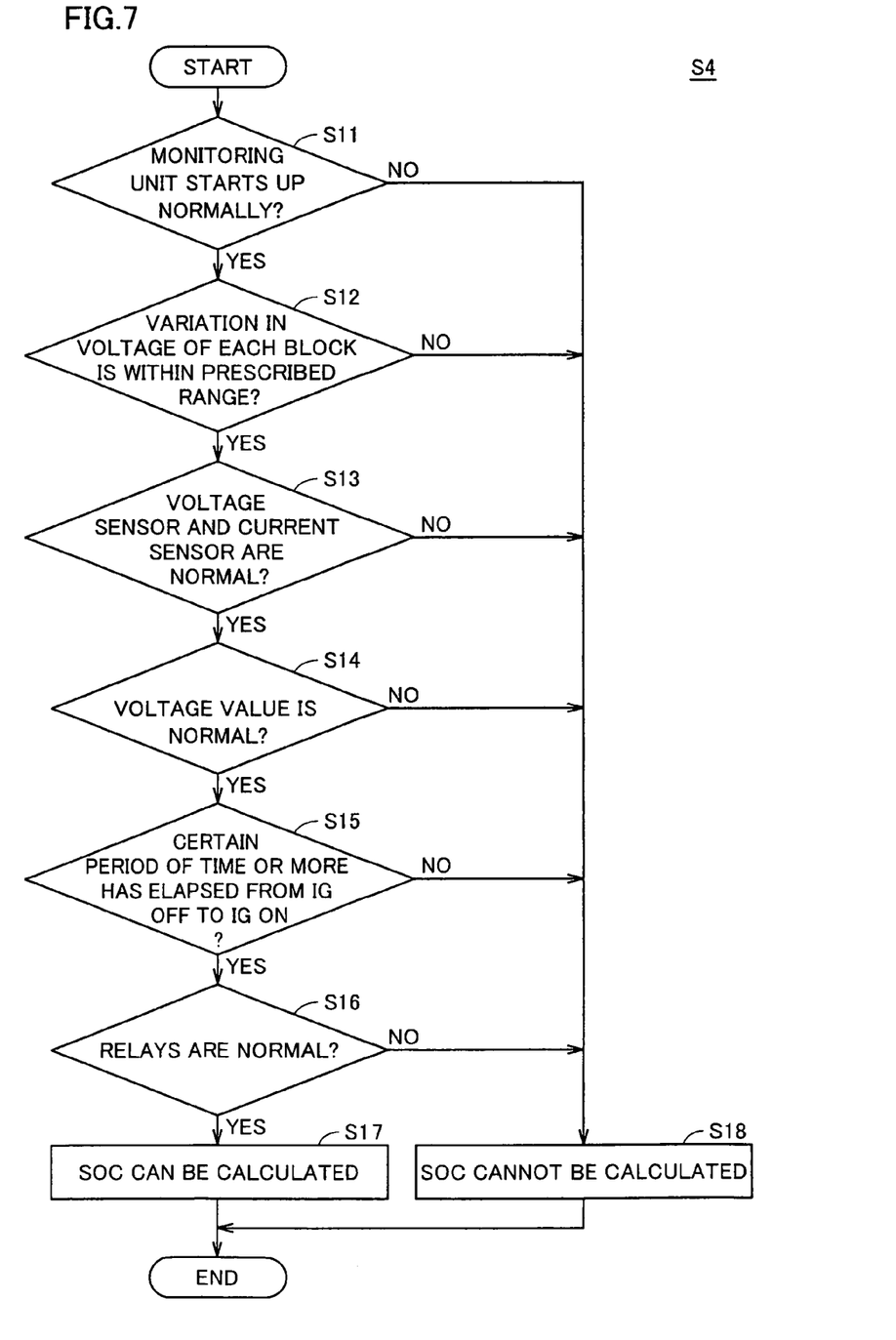
FIG. 7 is a flowchart for illustrating a process in step S4 shown in FIG. 4 in detail.

FIG. 7 is a flowchart for illustrating the process in step S4 shown in FIG. 4 in detail. Referring to FIGS. 7 and 3, in step S11, SOC calculating unit 66 determines whether or not monitoring unit 10 starts up normally. For example, SOC calculating unit 66 may determine whether or not monitoring unit 10 starts up normally, based on a value of a power supply voltage of monitoring unit 10, or may determine that monitoring unit 10 starts up normally based on input of the voltage value within a prescribed time period from when startup instruction IG is set to the ON state. In a case where monitoring unit 10 starts up normally (YES in step S11), the process proceeds to step S12. In a case where monitoring unit 10 does not start up normally (NO in step S11), SOC calculating unit 66 determines that SOC (value SOC1) cannot be calculated (step S18).

In step S12, SOC calculating unit 66 determines whether or not a variation in the voltage value is within a prescribed range by using the result obtained by sampling the voltage value of each of battery blocks B0-Bn. At this time, the voltage value itself is not a target of determination. The prescribed range may be defined, for example, by a voltage value such as "±1V" or by a proportion such as "±10%."

In a case where the variation in any of voltage values V0-Vn is within the prescribed range (YES in step S12), the process proceeds to step S13. In a case where the variation in any one of voltage values V0-Vn exceeds the prescribed range (NO in step S12), SOC calculating unit 66 determines that SOC cannot be calculated (step S18).

In step S13, SOC calculating unit 66 determines whether or not both of voltage sensor 11 and current sensor 12 are normal. This determination method can be implemented, for example, by providing notification to SOC calculating unit 66 if hybrid control unit 52 senses an abnormality of monitoring unit 10. In a case where both of voltage sensor 11 and current sensor 12 are normal (YES in step S13), the process proceeds to step S14. In a case where an abnormality occurs in at least one of voltage sensor 11 and current sensor 12 (NO in step S13), SOC calculating unit 66 determines that SOC cannot be calculated (step S18).

In step S14, SOC calculating unit 66 determines whether or not the voltage value is normal. In a case where any of voltage values V0-Vn is within the predetermined range, SOC calculating unit 66 determines that the voltage value is normal. In this case (YES in step S14), the process proceeds to step S15. In a case where any one of the voltage values is outside the predetermined range (NO in step S14), SOC calculating unit 66 determines that SOC cannot be calculated (step S18).

In step S15, SOC calculating unit 66 determines whether or not a certain period of time or more has elapsed before startup instruction IG is changed from the "OFF" state to the "ON" state. Polarization may occur within the battery immediately after startup instruction IG is set to the "OFF" state. This "certain period of time" refers to a period of time calculated in advance as a period of time from when startup instruction IG is set to the "OFF" state to when the polarization of the battery disappears (for example, several minutes). In a case where the certain period of time has elapsed from when startup instruction IG is set to the "OFF" state (YES in step S15), the process proceeds to step S16. Otherwise (NO in step S15), SOC calculating unit 66 determines that SOC cannot be calculated (step S18).

In step S16, SOC calculating unit 66 determines whether or not the system main relays are normal. This determination is performed in order to check that the voltage value obtained by SOC calculating unit 66 is the open voltage of battery B. SOC calculating unit 66 determines whether or not both of system main relay 28 on the positive electrode side of battery B and system main relay 30 on the negative electrode side of battery B (either system main relay SMRP or SMRG) are in the non-conduction state.

In a case where control signal CNT is at the L level, the system main relays on both electrode sides of battery B are not activated. The system main relays on both electrode sides of battery B, however, may be welded. Therefore, hybrid control unit 52 checks that the system main relays on both electrode sides are not welded upon activation of the system main relays. SOC calculating unit 66 determines whether or not the system main relays on both electrode sides of battery B are not welded, based on a signal RLT received from hybrid control unit 52. For example, in a case where the system main relays on both electrode sides of battery B are not welded, signal RLT is set to the L level. In a case where the system main relays on both electrode sides of battery B are welded, signal RLT is set to the H level.

In a case where control signal CNT is at the L level and signal RLT is at the L level (YES in step S16), SOC calculating unit 66 determines that SOC can be calculated (step S17). In a case where control signal CNT is at the H level or signal RLT is at the H level (NO in step S16), SOC calculating unit 66 determines that SOC cannot be calculated (step S18). When the process in step S17 or step S18 ends, the overall process ends.

Figure 8:
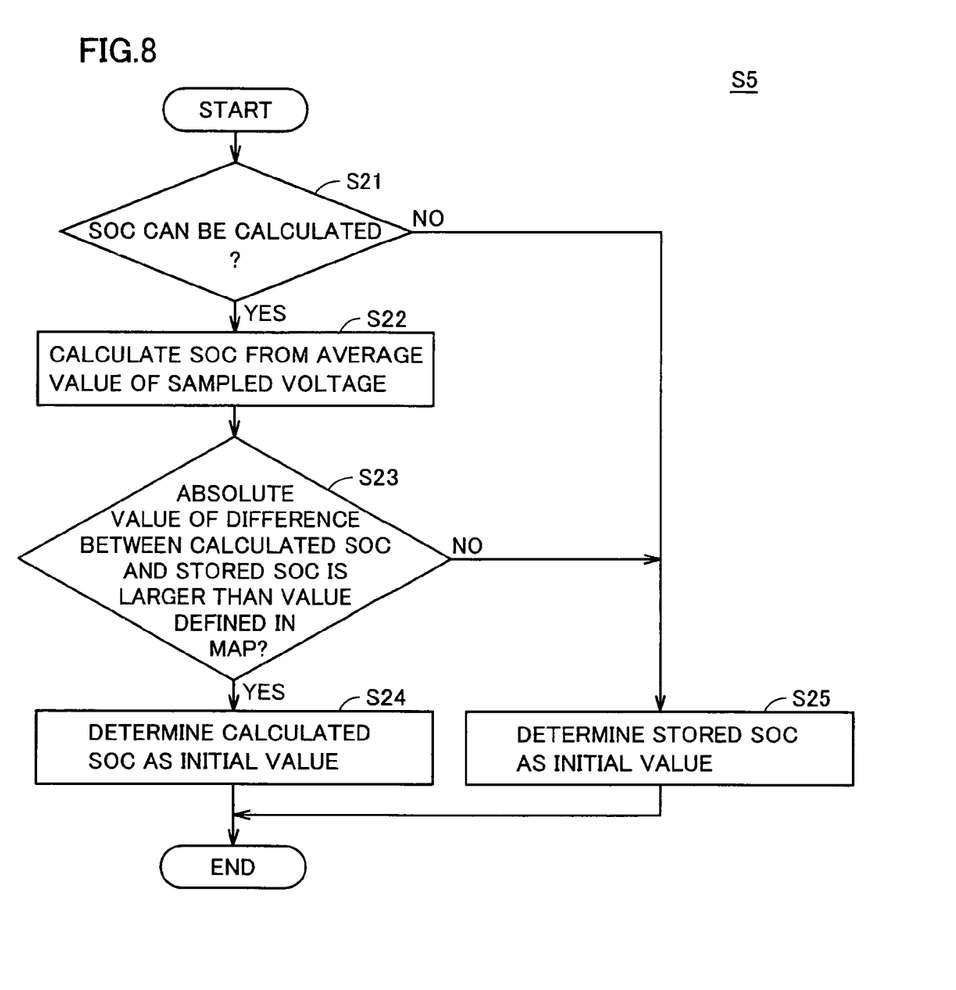
FIG. 8 is a flowchart for illustrating a process in step S5 shown in FIG. 4 in detail.
Figure 9:
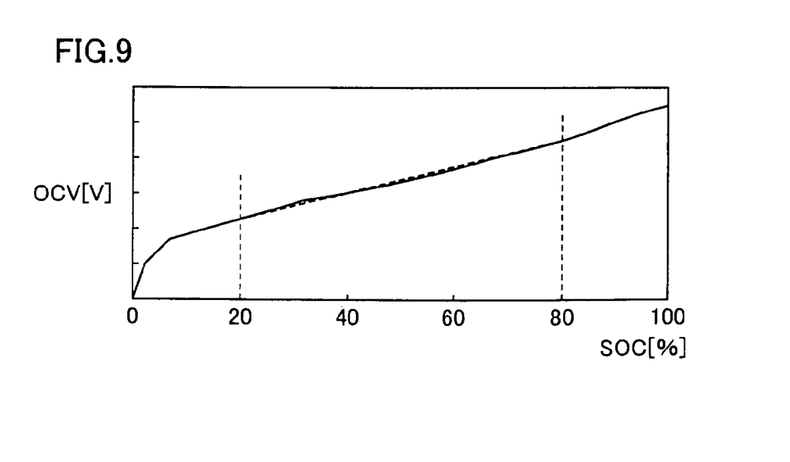
FIG. 9 shows the relationship between an open voltage (OCV) and an SOC of the battery.

FIG. 8 is a flowchart for illustrating the process in step S5 shown in FIG. 4 in detail. Referring to FIGS. 8 and 3, in a case where SOC can be calculated (YES in step S21), SOC calculating unit 66 averages a plurality of voltage values obtained by the sampling, and calculates SOC based on the average value and a map defining the relationship between the open voltage and SOC as shown in FIG. 9 (step S22). It is noted that SOC calculating unit 66 may correct SOC found from the map, based on the battery temperature.

FIG. 9 shows the relationship between the open voltage (OCV) and SOC of the battery. FIG. 9 shows the properties of the battery including a lithium ion battery. Referring to FIG. 9, the range of SOC during use of the battery is set to the range, for example, from 20 to 80%. In this range, SOC is substantially proportional to the open voltage. In other words, as SOC is increased, the open voltage of the battery is monotonically increased.

Figure 10:
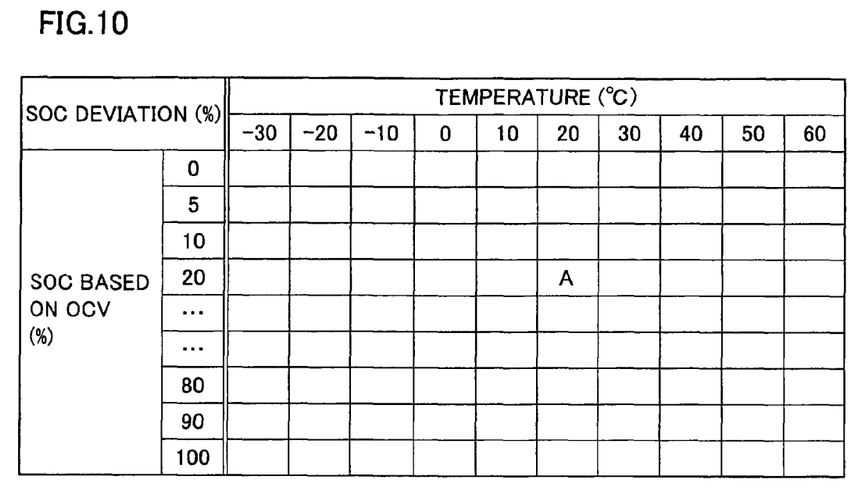
FIG. 10 is a diagram illustrating a map used in a process in step S23 shown in FIG. 8.

Referring to FIGS. 8 and 3, in step S23, initial value selecting unit 64 receives SOC calculated by SOC calculating unit 66 (value SOC1) and SOC stored in storage unit 62 (value SOC2), and in addition, refers to the map shown in FIG. 10. Initial value selecting unit 64 determines whether or not an absolute value of a difference between calculated SOC and stored SOC is larger than a reference value defined in the map.

Referring to FIG. 10, an SOC deviation (the absolute value of the difference between calculated SOC and stored SOC) is defined in the map, based on SOC calculated from OCV as well as the battery temperature when the vehicle was stopped last time (when the operation of the secondary battery ended). This SOC deviation is used as the reference value for determination. For example, when SOC calculated based on OCV is 20% and the battery temperature when the vehicle was stopped last time is 20° C., the reference value is defined as "A."

Referring to FIGS. 8 and 3, in a case where the absolute value of the difference between calculated SOC and stored SOC is larger than the value defined in the map (YES in step S23), initial value selecting unit 64 determines the calculated SOC value (value SOC1) as initial value SOCi (step S24). On the other hand, as a result of the determination process shown in FIG. 7, in a case where SOC calculating unit 66 cannot calculate SOC from OCV (NO in step S21), or in a case where the absolute value of the difference between calculated SOC and stored SOC is smaller than or equal to the value defined in the map (NO in step S23), initial value selecting unit 64 determines SOC stored in storage unit 62 (value SOC2) as initial value SOC1 (step S25). When the process in step S24 or step S25 ends, the overall process ends.

It is noted that, in a case where value SOC2 is selected as SOC initial value SOCi, SOC when the vehicle was stopped last time is used when the vehicle starts up next time, and therefore, continuity of the SOC value can be maintained. Therefore, an effect as shown in the following FIG. 11 is obtained, for example.

Figure 11:
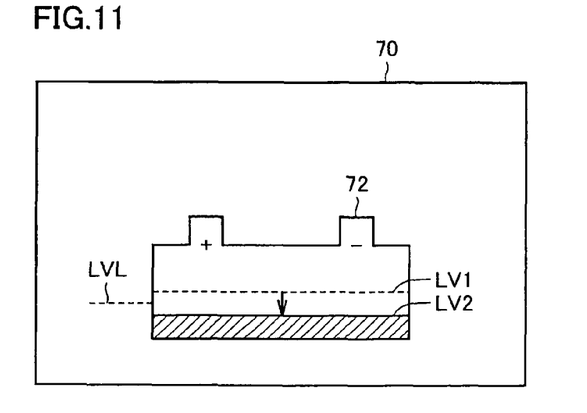
FIG. 11 is a diagram illustrating an effect obtained when a value SOC2 is selected as an SOC initial value SOCi.

FIG. 11 is a diagram illustrating an effect obtained when value SOC2 is selected as SOC initial value SOCi. Referring to FIG. 11, an icon 72 indicating the level of SOC of the battery is displayed on a display panel 70 of the vehicle. In a case where SOC is decreased to a level lower than a level LVL, icon 72, for example, changes its color from a normal color to a color different from the normal color in order to notify the driver that immediate charging is required.

A level LV1 indicates SOC when the vehicle was stopped last time, and a level LV2 indicates a level of SOC calculated based on the open voltage upon startup of the vehicle (that is, value SOC1). If a change from level LV1 to level LV2 occurs in spite of a short time period during which the vehicle is being stopped, the driver may misunderstand that the battery becomes exhausted rapidly. In this case, value SOC2 (stored value) is used as SOC initial value SOCi, so that the level of SOC displayed upon startup of the vehicle is set to level LV1. Therefore, the misunderstanding can be prevented.

It is noted that, although battery B may include a nickel hydride battery in the present embodiment, it is more preferable to include a lithium ion battery. The reason for this will be described hereinafter.

Figure 12:
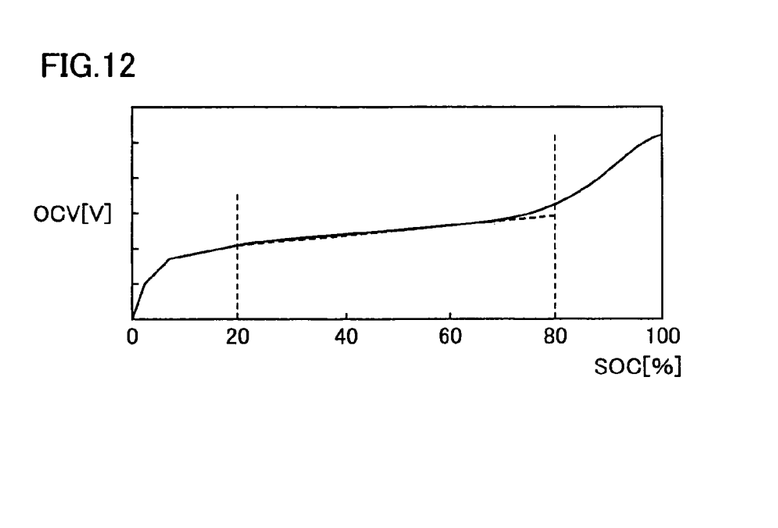
FIG. 12 shows the relationship between SOC and the open voltage of the battery including a nickel hydride battery.

FIG. 12 shows the relationship between SOC and the open voltage of the battery including a nickel hydride battery. Referring to FIGS. 12 and 9, in the nickel hydride battery as in the lithium ion battery, SOC is substantially proportional to the open voltage in the range that SOC is 20 to 80% (as SOC is increased, the open voltage of the battery is monotonically increased). Therefore, SOC can be calculated from the open voltage similarly in the battery including the nickel hydride battery.

A change in the open voltage with respect to SOC in the lithium ion battery, however, is larger than that in the nickel hydride battery. Therefore, in a case of the battery including the lithium ion battery, the accuracy of SOC can be increased when SOC is calculated based on the voltage value of the battery block.

<Modification>

In modifications that will be described hereinafter, the determination process in step S4, that is, the process of determining whether or not SOC can be calculated by using the open voltage of the battery, is simplified as compared with the process shown in FIG. 7. Processing load of battery control unit 56 can be reduced when the processes in the modifications are performed.

Figure 13:
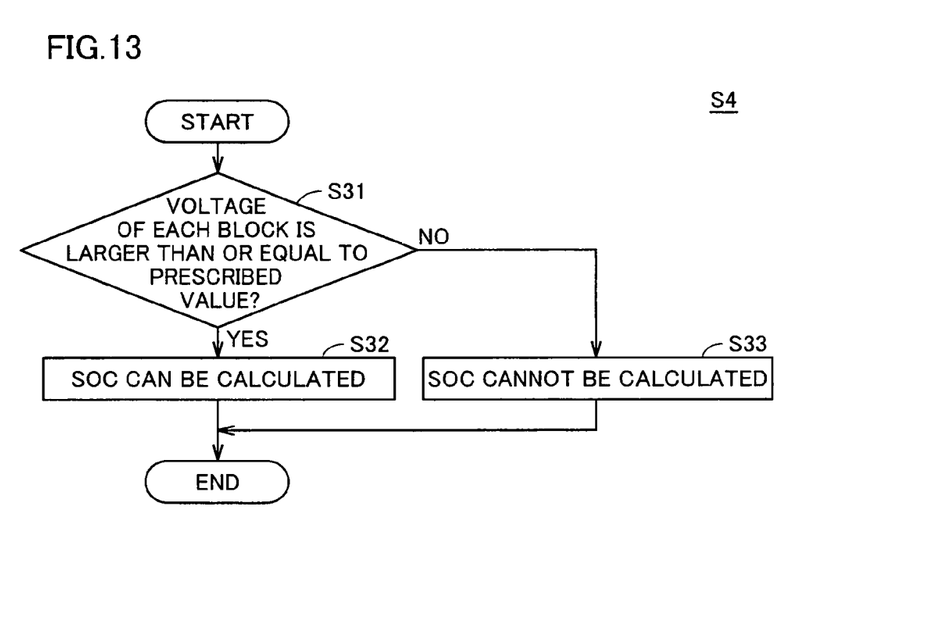
FIG. 13 is a flowchart illustrating a first modification of the process in step S4.

FIG. 13 is a flowchart illustrating a first modification of the process in step S4. Referring to FIGS. 13 and 3, SOC calculating unit 66 determines whether or not the voltage value of each of battery blocks B0-Bn (voltage values V0-Vn) is larger than or equal to a prescribed value (step S31). In a case where any of voltage values V0-Vn is larger than or equal to the prescribed value (YES in step S31), SOC calculating unit 66 determines that SOC can be calculated from the open voltage of battery B (step S32). In a case where any one of voltage values V0-Vn is below the prescribed value (NO in step S31), SOC calculating unit 66 determines that SOC cannot be calculated (step S33).

In order to determine more precisely whether or not voltage values V0-Vn are accurate, it is necessary to determine whether or not each voltage value is within a predefined range. By determining whether or not each voltage value is larger than or equal to a lower limit of the range, however, it can be determined accurately to some extent whether or not each battery block is normal.

Figure 14:
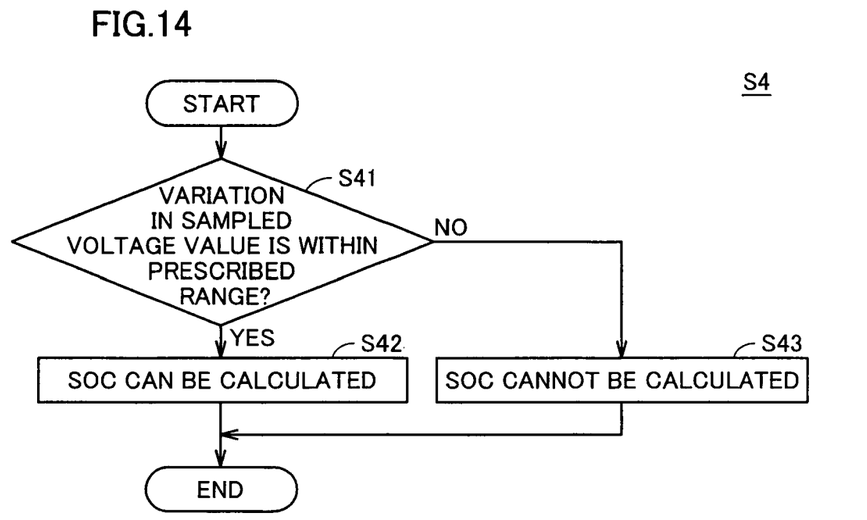
FIG. 14 is a flowchart illustrating a second modification of the process in step S4 shown in FIG. 4.

FIG. 14 is a flowchart illustrating a second modification of the process in step S4 shown in FIG. 4. Referring to FIGS. 14 and 3, SOC calculating unit 66 determines whether or not a variation in the sampled voltage value (voltage value of each of battery blocks B0-Bn) is within a prescribed range (step S41). This "prescribed range" may be defined, for example, by a voltage value such as "X1 (V) to X2 (V)," or as "standard value±Y (%)." In a case where any of the result obtained by sampling the voltage value of each of battery blocks B0-Bn is within the prescribed range (YES in step S41), SOC calculating unit 66 determines that SOC can be calculated from the open voltage of battery B (step S42). In a case where the sampling result in any one of the battery blocks exceeds the prescribed range (NO in step S41), SOC calculating unit 66 determines that SOC cannot be calculated (step S43).

Figure 15:
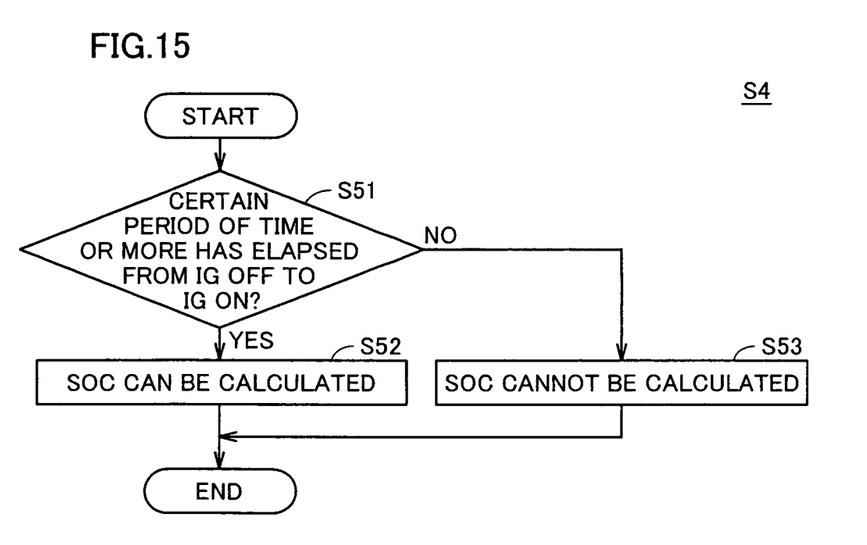
FIG. 15 is a flowchart illustrating a third modification of the process in step S4 shown in FIG. 4.

FIG. 15 is a flowchart illustrating a third modification of the process in step S4 shown in FIG. 4. Referring to FIGS. 15 and 3, SOC calculating unit 66 determines whether or not a certain period of time or more has elapsed before startup instruction IG is changed from the "OFF" state to the "ON" state (step S51). This "certain period of time" is a time period calculated in advance as a time period from when startup instruction IG is set to the "OFF" state to when the polarization of the battery disappears (for example, several minutes).

In a case where the certain period of time has elapsed from when startup instruction IG is set to the "OFF" state (YES in step S51), SOC calculating unit 66 determines that SOC can be calculated from the open voltage of battery B (step S52). In a case where the certain period of time does not have elapsed (NO in step S51), SOC calculating unit 66 determines that SOC cannot be calculated (step S53).

As described above, in the present embodiment, SOC calculating unit 66 calculates SOC (value SOC1) based on the open voltage of the battery upon startup of the vehicle (when the operation of the battery starts), and has calculated SOC (value SOC2) stored in storage unit 62 upon stop of the vehicle (when the operation of the battery ends). Initial value selecting unit 64 selects value SOC1 as initial value SOCi when the predetermined condition is satisfied (YES in all of the determination processes in steps S11 to S16, and YES in the determination process in each of steps S31, S41 and S51), and selects value SOC2 as initial value SOCi when this condition is not satisfied. As a result, according to the present embodiment, SOC can be accurately calculated upon startup of the vehicle (when the operation of battery B starts).

It is noted that the present embodiment has been described based on an example in which the present invention is applied to a series/parallel-type hybrid system where motive power of the engine is split by a power split device to be transmitted to an axle and a generator. The present invention, however, is widely applicable to a vehicle having a rechargeable power storage device mounted thereon.

It should be understood that the embodiments disclosed herein are illustrative and not limitative in any respect. The scope of the present invention is defined by the terms of the claims, rather than the description above, and is intended to include any modifications within the scope and meaning equivalent to the terms of the claims.

The invention claimed is:

1. A control device for a rechargeable power storage device mounted on a vehicle,
said power storage device being connected to a load via a connecting unit,
said connecting unit changing from a non-conduction state to a conduction state when an operation of said power storage device starts, and changing from said conduction state to said non-conduction state when the operation of said power storage device ends,
said control device comprising:
a calculating unit that (i) calculates a first value indicating a state of charge of said power storage device based on an open voltage of said power storage device when the operation of said power storage device starts and before said connecting unit is brought into the conduction state, and (ii) calculates said state of charge of said power storage device based on an initial value of said state of charge of said power storage device and charging/discharging electric power of said power storage device while said connecting unit is in the conduction state;
a storage unit that receives said state of charge of said power storage device calculated by said calculating unit based on the initial value and stores said state of charge as a second value, when the operation of said power storage device ends; and
a selecting unit that selects said first value as said initial value when a predetermined condition is satisfied, and selects said second value as said initial value when said predetermined condition is not satisfied,
said predetermined condition being defined as a condition that is satisfied in a case where said calculating unit is able to calculate said first value and in a case where an absolute value of a difference between said first value and said second value is larger than a reference value defined based on said first value and a temperature when the operation of said power storage device ends.

2. The control device for a power storage device according to claim 1, wherein
said calculating unit determines that said first value is calculable in a case where a value of said open voltage is larger than or equal to a prescribed value.

3. The control device for a power storage device according to claim 1, wherein
said calculating unit obtains a value of said open voltage of said power storage device for a plurality of times, and in a case where a variation in the obtained voltage values is within a prescribed range, said calculating unit determines that said first value is calculable.

4. The control device for a power storage device according to claim 1, further comprising:
a voltage sensing unit for sensing a voltage of said power storage device,
said predetermined condition being satisfied in a case where operations of both of said connecting unit and said voltage sensing unit are normal.

5. The control device for a power storage device according to claim 1, wherein
said predetermined condition is satisfied in a case where a time period from when the operation of said power storage device ends to when the operation of said power storage device starts is longer than a prescribed time period.

6. The control device for a power storage device according to claim 1, wherein
in a range of a value indicating said state of charge that is defined as a usage condition of said power storage device, said open voltage of said power storage device changes monotonically with respect to said value of said state of charge.

7. The control device for a power storage device according to claim 6, wherein
said power storage device includes a lithium ion battery.

8. The control device for a power storage device according to claim 6, wherein
said power storage device includes a nickel hydride battery.

9. A vehicle, comprising:
a rechargeable power storage device;
a load;
a connecting unit changing from a non-conduction state to a conduction state to connect said power storage device and the load when an operation of said power storage device starts, and changing from said conduction state to said non-conduction state when the operation of said power storage device ends; and
a control device for controlling said power storage device, said control device including
a calculating unit that (i) calculates a first value indicating a state of charge of said power storage device based on an open voltage of said power storage device when the operation of said power storage device starts and before said connecting unit is brought into the conduction state, and (ii) calculates said state of charge of said power storage device based on an initial value of said state of charge of said power storage device and charging/discharging electric power of said power storage device while said connecting unit is in the conduction state,
a storage unit that receives said state of charge of said power storage device calculated by said calculating unit based on the initial value and stores said state of charge as a second value, when the operation of said power storage device ends, and
a selecting unit that selects said first value as said initial value when a predetermined condition is satisfied, and selects said second value as said initial value when said predetermined condition is not satisfied,
said predetermined condition being defined as a condition that is satisfied in a case where said calculating unit is able to calculate said first value and in a case where an absolute value of a difference between said first value and said second value is larger than a reference value defined based on said first value and a temperature when the operation of said power storage device ends.

10. The vehicle according to claim 9, wherein
said calculating unit determines that said first value is calculable in a case where a value of said open voltage is larger than or equal to a prescribed value.

11. The vehicle according to claim 9, wherein
said calculating unit obtains a value of said open voltage of said power storage device for a plurality of times, and in a case where a variation in the obtained voltage values is within a prescribed range, said calculating unit determines that said first value is calculable.

12. The vehicle according to claim 9, wherein
said control device further includes a voltage sensing unit for sensing a voltage of said power storage device, and
said predetermined condition is satisfied in a case where operations of both of said connecting unit and said voltage sensing unit are normal.

13. The vehicle according to claim 9, wherein
said predetermined condition is satisfied in a case where a time period from when the operation of said power storage device ends to when the operation of said power storage device starts is longer than a prescribed time period.

14. The vehicle according to claim 9, wherein
in a range of a value indicating said state of charge that is defined as a usage condition of said power storage device, said open voltage of said power storage device changes monotonically with respect to said value of said state of charge.

15. The vehicle according to claim 14, wherein
said power storage device includes a lithium ion battery.

16. The vehicle according to claim 14, wherein
said power storage device includes a nickel hydride battery.

* * * * *